United States Patent [19]

Chang

[11] 3,926,643

[45] Dec. 16, 1975

[54] PHOTOPOLYMERIZABLE COMPOSITIONS COMPRISING INITIATOR COMBINATIONS COMPRISING THIOXANTHENONES

[75] Inventor: Catherine Teh-lin Chang, Wilmington, Del.

[73] Assignee: E. I. Du Pont de Nemours & Company, Wilmington, Del.

[22] Filed: May 16, 1974

[21] Appl. No.: 470,637

[52] U.S. Cl. .................... 96/115 P; 96/33; 96/35.1; 96/90 R; 96/115 R

[51] Int. Cl.[2] ........................ G03C 1/68; G03C 1/70

[58] Field of Search ............... 96/115 P; 204/159.24

[56] References Cited

UNITED STATES PATENTS

| | | | |
|---|---|---|---|
| 3,549,367 | 12/1970 | Chang et al. | 96/115 P |
| 3,725,231 | 4/1973 | Jahnke | 204/159.14 |
| 3,759,807 | 9/1973 | Osborn et al. | 204/159.23 |
| 3,787,212 | 1/1974 | Heimsch | 96/35.1 |
| 3,827,957 | 8/1974 | McGinniss | 204/159.23 |

*Primary Examiner*—Ronald H. Smith

[57] ABSTRACT

Thioxanthenones are used as photoinitiators, in admixture with other initiators, e.g., polynuclear quinones, lophine dimers, etc., in photopolymerizable systems.

9 Claims, No Drawings

PHOTOPOLYMERIZABLE COMPOSITIONS COMPRISING INITIATOR COMBINATIONS COMPRISING THIOXANTHENONES

BACKGROUND OF THE INVENTION

1. Field of the Invention

This invention relates to new photoinitiating agents activatable by actinic radiation and capable of inducing free radical addition polymerization in polymerizable compounds having at least one and preferably more than one terminal ethylenically unsaturated group. The invention also relates to photopolymerizable elements wherein the photopolymerizable layer contains at least one of said photoinitiating agents. More particularly it relates to such agents which are capable of increasing photospeed and have the ability of reducing the needed concentration of photoinitiators of the prior art when used in combination with them. The agents also improve the moisture and temperature sensitivity of photopolymer systems employing polyacrylates.

2. Description of the Prior Art

Photopolymerizable compositions suitable for image-forming layers are well-known in the art. Such elements are useful for preparing a variety of images for different purposes in the photochemical arts. For example the elements are useful in reproducing engineering drawings, as illustrated by Colgrove, U.S. Pat. No. 3,353,955, preparing lithographic printing plates as illustrated by Alles U.S. Pat. No. 3,458,311, in preparing printed circuits as illustrated by Celeste, U.S. Pat. No. 3,469,982, and in thermal transfer systems as illustrated by Burg and Cohen, U.S. Pat. No. 3,060,024.

In the photopolymerization of ethylenically unsaturated compounds it is well known to increase the speed of such polymerization by the addition of initiators activatable by actinic radiation. Of particular usefulness as initiators in photopolymerizable systems are the polynuclear quinones disclosed and claimed in Assignee's Patent, Notley U.S. Pat. No. 2,951,758, the initiating systems using a triarylimidazolyl dimer consisting of two lophine radicals bound together by a covalent bond as disclosed and described in Assignee's Chambers, U.S. Pat. No. 3,479,185 and the photoinitiating system using the initiating systems of the Chambers patent together with a p-aminophenyl ketone described in Assignee's Chang and Fan, U.S. Pat. No. 3,549,367. Many other initiators are also known such as benzoin methyl ether, 2,3-bornanedione, etc. The compounds of the present invention when incorporated into photopolymerizable compositions produce an improved film element exhibiting increased speed, and reduced moisture and temperature sensitivity. Further, when combined with other photoinitiators, such as a lophine dimer, a polynuclear quinone or benzoin methyl ether, these compounds improve the performance of the photoinitiators in the above areas. The thioxanthenones reduce the necessary concentration of polynuclear quinones in the initiating system and thereby reduce the tendency for the polynuclear quinones to crystallize out of the photosensitive compositions as is characteristic of said polynuclear quinones when used alone in the system.

SUMMARY OF THE INVENTION

It is an object of this invention to produce an improved photopolymerizable layer exhibiting increased photospeed, good image quality and reduced sensitivity to moisture and temperature. It is a further object to produce photopolymerizable layers containing new photoinitiators, activatable by actinic radiation, for free radical addition polymerization either when used alone or in combination with known photoinitiating systems.

The objects of this invention are achieved in a photopolymerizable composition by the improvement comprising a thioxanthenone photoinitiator and at least one different photoinitiator. Thioxanthenones have the following general formula

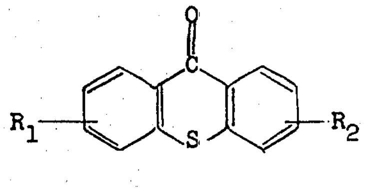

where $R_1$ and $R_2$ = H, alkyl, alkoxy, dialkylamino, halogen, etc.

DESCRIPTION OF THE PREFERRED EMBODIMENTS

Although thioxanthenones are good photoinitiators and are suitable for incorporation into a photopolymerizable layer to increase photospeed, in a preferred formulation the thioxanthenone is added with a polynuclear quinone, e.g., 9,10-phenanthrenequinone, as a mixed initiator system for improved photospeed and improved physical characteristics. Thus, in one embodiment of this invention a mixture of thioxanthenone and 9,10-phenanthrenequinone in an approximately 1:1 ratio is added to a photopolymerizable composition as the photoinitiating system. Other useful photoinitiating systems which contain thioxanthenones and which may be incorporated into a photopolymerizable composition to produce an improved image-forming layer or element include the following 1. A thioxanthenone and a 2,4,5-triarylimidazolyl dimer consisting of two lophine radicals bound together by a single covalent bond.
2. A thioxanthenone, said lophine dimer, and a leuco dye.
3. A thioxanthenone and 2-tertiary butyl anthraquinone.
4. A thioxanthenone and 2-ethyl anthraquinone.
5. A thioxanthenone and benzophenone.
6. A thioxanthenone and 4,4'-bis(dimethylamino) benzophenone.
7. A thioxanthenone and benzoin methyl ether.
8. Thioxanthenone and 3,6-bis(dimethylamino) thioxanthenone.
9. A thioxanthenone and 2,3-bornanedione.

When used alone, thioxanthenone and substituted thioxanthenones are good photoinitiating agents. When combined with other photoinitiators, they serve as co-photoinitiators and enhance the catalytic effect. When the thioxanthenones are used in combination with a polynuclear quinone, this cophotoinitiating effect is observed and when the thioxanthenones are used in combination with a lophine dimer and a leuco dye the increased rate of photopolymerization is accompanied by a color-forming effect which results in the formation of a visible image.

Lophine dimers which may be used in combination with the heterocondensed aromatic ketones of this invention include those containing at least one 2,4,5-triarylimidazolyl dimer consisting of two lophine radicals bound together by a single covalent bond, e.g. 2(o-chlorophenyl)-4,5-diphenylimidazolyl dimer and others described in Chang and Fan, U.S. Pat. No. 3,549,367.

Polynuclear quinones which may be substituted for the lophine dimers to produce the improved results noted above include phenanthrenequinone, 1,2-naphthoquinone, chrysenequinone, and 2,7-di-tertiary butyl-phenanthraquinone and the other polynuclear quinones disclosed in Notley, U.S. Pat. No. 2,951,758. The tendency of polynuclear quinones, e.g., o-quinones, to crystallize is greatly decreased when a portion of the polynuclear quinones in the initiating system is replaced by a thioxanthenone.

The p-aminophenyl ketones are sensitive to light and act as co-initiators for photopolymerization reactions when combined with thioxanthenones as photoinitiators in the photopolymerizable elements of this invention. Suitable p-aminophenyl ketones are disclosed in the above Chang and Fan patent.

The concentration of the thioxanthenones useful in practicing this invention is only limited by their solubility in the photopolymer coating composition.

It is usually advantageous to include other components in the photopolymerizable formulation, such as solvent, sensitizer, plasticizers, and/or binders to provide intimate contact among the ingredients and to facilitate their application to substrates in coating operations.

A wide range of nonpolymerizable plasticizers are effective in achieving improved exposure and development temperature latitude as disclosed in the above Chang and Fan patent.

In addition, the photopolymerizable compositions and layers may contain a colorant and/or a color-producing agent. Useful colorants include the dyes and pigments described in Assignee's Burg et al., U.S. Pat. No. 3,060,023. Suitable color-producing agents are the leuco dyes. The amine-substituted leuco dyes can function both in the role of a color-forming agent and a free-radical generating agent. Especially useful leuco dyes are those having at least one dialkylamino group. Also any amine-substituted leuco triphenylmethane dye or various salts of the dye, e.g., the hydrochloride of a leuco dye can be used. Suitable dyes are disclosed in the above Chang and Fan Patent.

The compositions of this invention containing thioxanthenones may also contain a thermoplastic, macromolecular, organic polymer binder, e.g., cellulose acetate, cellulose acetate butyrate, polymethyl acrylate, polymethyl methacrylate, methyl methacrylate copolymerized with methacrylic acid, etc. Other useful binders are disclosed in Colgrove, U.S. Pat. No. 3,353,955. To the binder in a suitable solvent is added an ethylenically unsaturated compound capable of free-radical-initiated, chain propagating addition polymerization, e.g., pentaerythritol triacrylate, polyethylene glycol diacrylates, triethylene glycol diacrylate, polymethyl glycol dimethacrylates, polymethylene diacrylates and dimethacrylates, trimethylol propane triacrylate and trimethacrylate. Preferred monomers have at least two terminal ethylenic groups.

In addition, the polymerizable polymers disclosed in Schoenthaler U.S. Pat. No. 3,418,295, and Celeste, U.S. Pat. No. 3,448,089 can be used in lieu of or in combination with the monomer-binder systems. If desired, a cover sheet, such as described in Assignee's Heiart, U.S. Pat. No. 3,060,026 can be laminated to the surface of the photopolymerizable layer, or the layer can be overcoated with a wax layer such as described in Assignee's Burg, U.S. Pat. No. 3,203,805, or a layer of oxygen impermeable polyvinyl alcohol or other water soluble colloid composition can be coated as described in Assignee's, Alles, U.S. Pat. No. 3,458,311.

Development of the exposed film element may be accomplished by solvent washout, thermal transfer, pressure transfer, pigment application to unpolymerized areas, differential adhesion of exposed vs. unexposed areas, etc. Development may produce either a relief, a resist, or an image on a separate receptor.

Typical inert substrates suitable for coating the photopolymerizable compositions of this invention include materials commonly used in the photomechanical arts, such as paper, cardboard, films of high polymers such as regenerated cellulose, cellulose esters, e.g. cellulose acetate, triacetate, and cellulose nitrate, polyesters of glycol and terphthalic acid, vinyl polymers and copolymers, polyethylene, polyvinyl acetate, polymethyl methacrylate, polyvinyl chloride, glass and metals, e.g., copper, aluminum, steel and copper clad epoxy fiber glass boards.

The invention is illustrated by the following examples.

EXAMPLE 1

Illustrative of the lithographic printing plate as described in Alles, U.S. Pat. No. 3,458,311, a photosensitive composition was formulated from the following ingredients:

| | | |
|---|---|---|
| Poly(methyl methacrylate/methacrylic acid) (90/10) | 10.00 | grams |
| Trimethylol propane triacrylate | 3.75 | " |
| Mixed esters of triethylene glycol dicaprate and dicaprylate | 1.25 | " |
| Methyl ethyl ketone | 105.00 | " |

To the above composition there was added as the sole initiator, varying amounts of the thioxanthenones as indicated in the table below. The compositions were thoroughly mixed by mechanical stirring and coated on a grained aluminum plate and dried. The plates were given a protective overcoating with the following composition:

| | | |
|---|---|---|
| Polyvinyl pyrrolidone (M.W. 30,000) | 90.0 | grams |
| Polyvinyl alcohol (88% hydrolyzed polyvinyl acetate) (Med. visc.) | 60.0 | " |
| Ethylene glycol monoethyl ether | 45.0 | ml. |
| Ethanol | 45.0 | ml. |
| Iso-octyl phenoxy ethoxy ethanol (9–10 ethoxy groups) (added as a 10% aqueous solution | 1.5 | ml. |
| Water to make | 3.0 | liters |

The plates were dried and exposed through a transparency (21 $\sqrt{2}$ step Graphic Arts Technical Foundation exposure wedge) in a vacuum frame by a carbon arc (B-1C Constantarc — 140 amp. No. 1112 — Ld612 Macbeth Arc Lamp Company, Philadelphia, Pa.) for the times shown in the table at a distance of 56 inches from the lamp. The plates were developed by washing out the unexposed parts of the coatings using a solution of the following composition:

| | | |
|---|---|---|
| Trisodium phosphate ($Na_3PO_4 \cdot 12\ H_2O$ | 25.0 | grams |
| Sodium Phosphate (monobasic $NaH_2PO_4 \cdot H_2O$) | 4.4 | " |

-continued

| | |
|---|---|
| 2-butoxyethanol | 55.0 ml |
| Iso-octyl phenoxyethoxyethanol 10% aqueous solution (9 to 10 ethoxy groups) | 2.0 ml |
| Water to make | 1.0 liter |
| pH adjusted to 11.0 | |

The exposed areas of the developed plate accepted conventional lithographic greasy inks and the clear areas of the aluminum support were readily wetted with water to give a high quality lithographic plate.

TABLE

| Thioxanthenone-grams to above composition | Photospeed-100 sec. exposure-steps remaining of $\sqrt{2}$ step wedge after processing |
|---|---|
| 0.1 | 6 |
| 0.2 | 7 |
| 0.4 | 8 |
| 2-Chlorothioxanthenone-grams added to above composition | Photospeed-30 sec. exposure-steps remaining of $\sqrt{2}$ step wedge after processing |
| 0.3 | 5 |
| 3,6-bis-(dimethylamino)-thioxanthenone-grams added to above composition | Photospeed-100 second exposure-steps remaining of $\sqrt{2}$ step wedge after processing |
| 0.154 | 9 |

EXAMPLE 2

Example 1 was repeated using 0.21 gram of thioxanthenone mixed with aromatic ketones shown in the following table. All other ingredients, conditions of coating and overcoating and drying were carried out as described in Example 1. The elements were exposed as described in Example 1 and processed in a solution similar to that set forth in Example 1 but containing 70.0 ml. of 2-butoxyethanol.

TABLE

| Aromatic Ketone | Amounts in grams | No. of $\sqrt{2}$ steps left after Processing |
|---|---|---|
| A None | — | 7 |
| B 4,4'-bis(dimethylamino) benzophenone | 0.268 | 12 |
| C 2-tertiary butyl-anthraquinone | 0.264 | 9 |
| D 2-ethylanthraquinone | 0.236 | 9 |

EXAMPLE 3

Example 2 was repeated using a mixture of 0.364 gram of 2-chlorothioxanthenone and 0.20 gram of 4,4'-bis (dimethylamino) benzophenone. The element was exposed for 30 seconds and developed in a solution of the following formulation:

| | |
|---|---|
| Distilled water | 750.0 ml |
| Sodium silicate | 78.0 grams |
| 2-butoxy ethanol | 60.0 ml |
| Iso-octyl phenoxyethoxyethanol 10% aqueous sol. (9 to 10 ethoxy groups) | 2.0 ml |
| Water to make | 1.0 liter |
| pH adjusted to 11.05 | |

The number of steps of the $\sqrt{2}$ step wedge after development was 9.

EXAMPLE 4

Example 3 was repeated using a mixture of 0.20 gram of thioxanthenone and 0.154 gram of 3,6-bis(dimethylamino) thioxanthenone. The exposure time was 100 seconds and the exposed element was developed in the processing solution set forth in Example 1. The number of steps of the $\sqrt{2}$ step wedge after processing was 13.

EXAMPLE 5

Example 4 was repeated using 0.154 gram of 3,6-bis(dimethylamino)thioxanthenone and 0.264 gram of 2-tertiary butyl anthraquinone. The number of steps remaining after processing was 11.

EXAMPLE 6

Example 4 was repeated using 0.154 gram of 3,6-bis(dimethylamino) thioxanthenone and 0.208 gram of benzophenone as the initiator mixture. The number of steps remaining after development was 12.

EXAMPLE 7

Example 4 was repeated using 0.154 gram of 3,6-bis(dimethylamino) thioxanthenone and 0.224 gram of benzoin methyl ether as the initiator mixture. The number of steps remaining after development was 12.

EXAMPLE 8

Example 4 was repeated using 0.154 gram of 3,6-bis(dimethylamino) thioxanthenone and 0.164 gram of 2,3-bornanedione. The exposed element was developed in the solution described in Example 2. The number of $\sqrt{2}$ steps remaining after processing was 13.

EXAMPLE 9

Example 8 was repeated using 0.30 gram of 3,6-bis(-dimethylamino)thioxanthenone and 0.50 gram of 2-o-chlorophenyl-4,5-bis(m-methoxyphenyl) imidazolyl dimer as the initiator mixture. The number of $\sqrt{2}$ steps remaining was 14. When the dimer is used alone as the initiator an exposure of 162 seconds was required to show 4 $\sqrt{2}$ steps and as shown in Example 1 using 0.154 gram of the thioxanthenone compound on exposure of 100 seconds showed 9 $\sqrt{2}$ steps thus it is seen that a synergistic effect is obtained.

EXAMPLE 10

Example 8 was repeated using 0.21 gram of thioxanthenone and 0.45 gram of tris(p-diethylamino-o-tolyl) methane. The number of steps remaining after development was 11. The image of the step wedge showed visible color by virtue of leuco dye.

EXAMPLE 11

Three photopolymerizable compositions were made as described in Example 1 using mixtures of 0.21 gram of thioxanthenone and three co-initiators as shown in the table below. The elements were exposed for 100 seconds and developed in the developer of Example 2. The number of steps remaining after development is shown in the table.

TABLE

| Co-initiator | Amount in Grams | $\sqrt{2}$ steps remaining |
|---|---|---|
| 7-diethylamino-4- | | |

TABLE-continued

| Co-initiator | Amount in Grams | $\sqrt{2}$ steps remaining |
|---|---|---|
| methyl coumarin | 0.23 | 8 |
| 1,4-bis(5-phenyl-oxazole-2-yl) benzene | 0.270 | 8 |
| 4,4'-bis(dimethyl-amino)-benzophenone | 0.268 | 12 |

EXAMPLE 12

A photopolymerizable composition was made as in Example 11 to which there was added 0.4 gram of thioxanthenone and 0.174 gram of N-phenyl glycine in place of the initiator combinations of that example. After exposure for 100 seconds and development as in Example 2 an image of 11 $\sqrt{2}$ steps remained on the plate.

EXAMPLE 13

A photopolymerizable composition was made as in Example 12 to which was added 0.2 gram of thioxanthenone, 0.374 gram of 2-o-chlorophenyl-4,5-bis (m-methoxy-phenyl) imidazolyl dimer and 0.157 gram of o-thiol benzoic acid in place of the initiator combinations of that example. Exposure and development as in Example 12 gave an image of 16 $\sqrt{2}$ steps.

The novel initiator compounds of this invention may be used in the thermal transfer systems described in Burg and Cohen, U.S. Pat. No. 3,060,024, and the following example illustrates this application.

EXAMPLE 14

A polymerizable composition was made from the following ingredients:

| | |
|---|---|
| Polymethylmethacrylate | 10.0 grams |
| Trimethylol propane triacrylate | 10.0 grams |
| Mixed ester of triethylene glycol dicaprate and dicaprylate | 4.0 grams |
| Trichloroethylene | 100.0 grams |

To the above composition, there were added the various initiators and mixtures thereof as shown in the accompanying table. After the constituents were thoroughly mixed, the compositions were coated on a 0.004 inch polyethylene terephthalate film having an anchoring layer as described in Alles, U.S. Pat. No. 2,779,684. After coating and drying the layers, they were laminated with sheets of 0.001 inch polyethylene terephthalate film. The elements were exposed in a vacuum frame as described in Example 1 using the 21 $\sqrt{2}$ step wedge as a light modulating means. The 0.001 inch cover sheet was delaminated and the pigment, molybdate orange was dusted on the surface of the layer. The unpolymerized areas retained the pigment while the polymerized areas did not retain the pigment to give a positive image of the original. This image could be transferred to a paper support to give a glossy, stain free image of good quality. The results of different initiators and coinitiators in this type of system are listed below together with the step wedge speed attained at different exposure times.

| Initiating System and Amounts | Exposure Time | $\sqrt{2}$ Steps Remaining |
|---|---|---|
| 3,6-bis(dimethylamino) thioxanthenone 0.80 grams | 120 secs. | 1 |
| Thioxanthenone 0.88 grams | 120 secs. | 2 |
| 3,6-bis(dimethylamino) thioxanthenone 0.80 grams + 2,3-bornanedione 0.68 grams | 7 secs. | 5 |
| 2-chlorothioxanthenone 0.96 grams | 15 secs. | 2 |
| 4,4'-bis(dimethylamino) benzophenone 1.10 grams + 2-chlorothioxanthenone 0.96 grams | 1 sec. | 3 |

EXAMPLE 15

This example illustrates the use of a mixture of a substituted thioxanthenone with other initiators in photopolymerizable compositions suitable for making resists for the preparation of, for example, printed circuits as described in the process disclosed in Celeste, U.S. Pat. No. 3,469,982.

Two photopolymerizable compositions were formulated from the following ingredients:

| | Amounts in Grams A | B |
|---|---|---|
| Polymethylmethacrylate | 56.0 | 58.2 |
| Pentaerythritol triacrylate | 35.0 | — |
| Trimethylolpropane triacrylate | — | 26.4 |
| Triethylene glycol diacetate | 5.0 | 8.4 |
| 2-Chlorothioxanthenone | 1.73 | 1.73 |
| 4,4'-bis(dimethylamino) benzophenone | 0.347 | 0.347 |
| Victoria Pure Blue B.O. C.I 42595 | 0.15 | 0.15 |
| Methylene Chloride | 235.0 | 235.0 |

The solutions were coated with a .010 inch doctor knife on to a 0.001 inch polyethylene terephthalate film. The coatings were dried and then laminated to cleaned copper-clad epoxy fiber glass boards at 100°C. at 6 feet per minute with 2 pounds of force per lineal inch at the nip as described in the above mentioned Celeste patent.

The elements were exposed for three minutes through the film support through the step wedge described above in a nuArc "Flip Top" Plate Maker (model FT26M-2) manufactured by the nuArc Company, Chicago, Ill. The film support was then stripped off and the exposed layer was developed by spraying the surface of the exposed layer with methyl chloroform at 20°C for 55 seconds. The plate having the layer of the A formula showed a 9 $\sqrt{2}$ step image remaining on the copper board. The B formula gave a 10 step image. It is obvious that these formulae could be used to make resists suitable for the preparation of printed circuits.

EXAMPLE 16

This example illustrates the use of a mixture of a thioxanthenone with other initiators in photopolymerizable compositions to reduce moisture and temperature sensitivity and to reduce background specks (after processing) caused by initiator crystallization in the composition.

Two photopolymerizable compositions were formulated from the following components:

| | Amounts in Grams A | B |
|---|---|---|
| Polymethylmethacrylate | 3.01 | 3.01 |
| Polyoxyethylene trimethylol propane triacrylate | 3.92 | 3.92 |
| Phenanthrenequinone | 1.51 | 0.91 |
| Thioxantheneone | — | 0.91 |
| Polyoxyethylene lauryl ether | 0.63 | 0.63 |
| Jungle Black pigment C.I. 1 | 3.42 | 3.42 |
| Sodium metabisulfite (4.8% water solution) | 0.33 | 0.33 |
| Trichloroethylene | 88.52 | 88.52 |

Each of the resulting compositions was thoroughly mixed by ball-milling and coated on 0.001 inch thick transparent polyethylene terephthalate film to give a dry thickness of about 0.00015 inch. The surface of each photopolymerizable layer was laminated at 124°C. to the drawing surface of a drafting film of the type described in Example I of Van Stappen U.S. Pat. No. 2,964,423 issued Dec. 13, 1960.

A sample of each laminated element was exposed through a 21 $\sqrt{2}$ step exposure wedge through the transparent film support by means of a Model 60W, "Revolute Rockette" exposing device manufactured by the Bruning Corporation and separated by peeling apart. For Element A containing only phenanthrenequinone the positive image of the step wedge on the drafting film had only 3 $\sqrt{2}$ steps removed and on the uncovered drawing surface there were numerous black spots or "pepper" indicating extensive crystallization of phenanthrenequinone. For Element B containing thioxanthenone and reduced concentration of phenanthrenequinone 5 $\sqrt{2}$ steps were uncovered indicating increased photospeed and there was no pepper indicating reduced initiator crystallization.

Samples of Element A and Element B were tested for moisture and temperature sensivity to storing in a controlled environment for one week before use. Results are exemplified in the following table.

| Age | Storage Temp(°C) | Storage RH(%) | Speed In $\sqrt{2}$ Steps Uncovered A | B |
|---|---|---|---|---|
| Fresh | 25 | 50 | 3.0 | 5.0 |
| 1 Week | 50 | Ambient | 7.0 | 7.5 |
| 1 Week | 25 | 80 | 4.5 | 7.0 |
| 1 Week | 25 | 95 | 5.0 | 7.0 |

Sample B containing the reduced concentrate of phenanthrenequinone and thioxanthenone has reduced temperature and moisture sensitivity.

The heterocondensed aromatic ketones of this invention may be incorporated into photopolymer lithographic printing plates and all other photopolymer compositions when it is desirable to increase the photospeed, reduce the possibility of crystallization of certain polynuclear quinones in the layer because of better solubility, reduce moisture sensitivity under conditions of high humidity, obtain better picture quality and obtain decreased temperature sensitivity. The thioxanthenones are useful in the production of relief printing plates as disclosed in Plambeck, U.S. Pat. No. 2,760,863.

Although the invention has been described in terms of its applicability to photopolymerizable imaging compositions, the thioxanthenone/polynuclear quinones or thioxanthenone/lophine dimer combinations may be incorporated into any system where it is desirable to produce a light-actuated polymerizing effect.

The amount of the thioxanthenone compound which will be found useful in photopolymerizable layers can vary widely, e.g., from 0.02% by weight of the layer to the limit of solubility in the coating composition. A preferred range is 0.03 to 15% by weight.

The amount of polynuclear quinone and lophine dimer and other initiators also may vary considerably, e.g., from about 0.05% to 5% by weight or more. A preferred range is 0.10 to 4.0% by weight of the coating composition.

The photopolymerizable composition usually comprises a macromolecular organic binder and a monomer containing at least one and preferably two or more terminal ethylenically unsaturated groups capable of free radical initiated addition polymerization. In general, 3 to 97% binder and 97 to 3% by weight, respectively, of monomer and binder may be present in the layer. However, photopolymerizable polymers may also be used such as those disclosed in Schoenthaler, U.S. Pat. No. 3,418,295.

The novel image forming compositions described above can be coated on or laminated to, if in sheet or layer form, various supports, including paper, metal foils or plates or films. Any of the specific supports described in the patents listed above, especially those set forth in Colgrove, U.S. Pat. No. 3,353,955; Alles, U.S. Pat. No. 3,458,311, Celeste, U.S. Pat. No. 3,469,982 and Burg and Cohen, U.S. Pat. No. 3,060,024 can be used.

The heterocondensed aromatic ketones (i.e., thioxanthenones) of this invention by themselves enhance the photographic speed of film elements coated with photopolymerizable compositions. Furthermore, when used in combination with lophine dimers or polynuclear quinones, the aromatic ketones give a synergistic effect to the photographic speed. In addition, when the aromatic ketones of this invention are used in combination with polynuclear quinones, e.g., 9,10-phenanthrenequinone, it requires less of these latter initiators to obtain maximum photospeed, thus substantially decreasing or eliminating any tendency for them to crystallize in the system on aging as was the case heretofore. An added advantage is that when combined with the polynuclear quinones, the aromatic ketones of this invention provide reduced moisture sensitivity and decreased temperature sensitivity of the systems.

I claim:

1. In a photopolymerizable composition the improvement comprising the combination of a thioxanthenone photoinitiator and at least one other photoinitiator selected from the group consisting of a lophine dimer, a polynuclear quinone compound, 2,3-bornanedione, 4,4'-bis(dimethylamino) benzophenone, and benzoin methyl ether.

2. A photopolymerizable composition according to claim 1 wherein said lophine dimer is 2-o-chlorophenyl-4,5-bis(m-methoxyphenyl) imidazolyl dimer.

3. A photopolymerizable composition according to claim 1 wherein said polynuclear quinone compound is selected from an anthraquinone and a phenanthrenequinone.

4. A photopolymerizable composition according to claim 1, said thioxanthenone being selected from thioxanthenone, 2-chlorothioxanthenone, and 3,6-bis(dimethylamino)-thioxanthenone.

5. A photopolymerizable composition according to claim 1 containing a macromolecular organic binder and an ethylenically unsaturated compound capable of free radical generated addition polymerization, said thioxanthenone photoinitiator being present in an amount of at least 0.02 percent by weight of said composition.

6. A photopolymerizable composition according to claim 1, said other photoinitiator being present in an amount of at least 0.05 percent by weight of said composition.

7. A photosensitive element comprising a support bearing a layer of the composition of claim 5.

8. A photosensitive element according to claim 7, said composition containing a macromolecular acrylic polymer binder, an ethylenically unsaturated compound having at least two acrylate groups, and an initiating amount of a mixture of 9,10-phenanthrenequinone and thioxanthenone.

9. In a photopolymerizable composition the improvement comprising a photoinitiating mixture of thioxanthenone and 3,6-bis(dimethylamino) thioxanthenone.

* * * * *